310-335

8/21/84 XR 4,467,237

United States Patent [19]

Piaget et al.

[11] Patent Number: 4,467,237

[45] Date of Patent: Aug. 21, 1984

[54] MULTIELEMENT ULTRASONIC PROBE AND ITS PRODUCTION PROCESS

[75] Inventors: Bernard Piaget, Venon; Jean-Francois Piquard, Vizille, both of France

[73] Assignee: Commissariat a l'Energie Atomique, Paris, France

[21] Appl. No.: 272,096

[22] Filed: Jun. 10, 1981

[30] Foreign Application Priority Data

Jun. 25, 1980 [FR] France ............................... 80 14100

[51] Int. Cl.³ ............................................ H01L 41/22

[52] U.S. Cl. .................................... 310/334; 310/335; 339/17 F

[58] Field of Search ............... 310/322, 334, 339, 340, 310/364, 365, 335; 339/17 F; 367/164

[56] References Cited

U.S. PATENT DOCUMENTS

| | | | |
|---|---|---|---|
| 3,579,206 | 5/1971 | Grange | 340/173.1 |
| 3,818,415 | 6/1974 | Evans et al. | 339/17 F |
| 3,952,387 | 4/1976 | Iinuma et al. | 29/25.35 |
| 4,217,684 | 8/1980 | Brisken et al. | 29/25.35 |
| 4,385,255 | 5/1983 | Yamaguchi et al. | 310/335 |

FOREIGN PATENT DOCUMENTS

| | | | |
|---|---|---|---|
| 224179 | 11/1962 | Austria | 367/164 |

*Primary Examiner*—J. D. Miller
*Assistant Examiner*—D. L. Rebsch
*Attorney, Agent, or Firm*—Oblon, Fisher, Spivak, McClelland & Maier

[57] ABSTRACT

Multielement ultrasonic probe production process connecting a piezoelectric ceramic block incorporating an upper conductive layer and a lower layer to two printed circuits having a metallized face and a face provided with conductive strips, electrically connecting one of the conductive strips to one of the faces of the printed circuits and the other conductive strip to the other face of said circuits, cutting out said block and the upper part of said circuits so as to form equidistant piezoelectric elements and mechanically insulating them from one another, as well as the connections with respect to each element.

The invention has application to medical echography.

2 Claims, 7 Drawing Figures

FIG.1
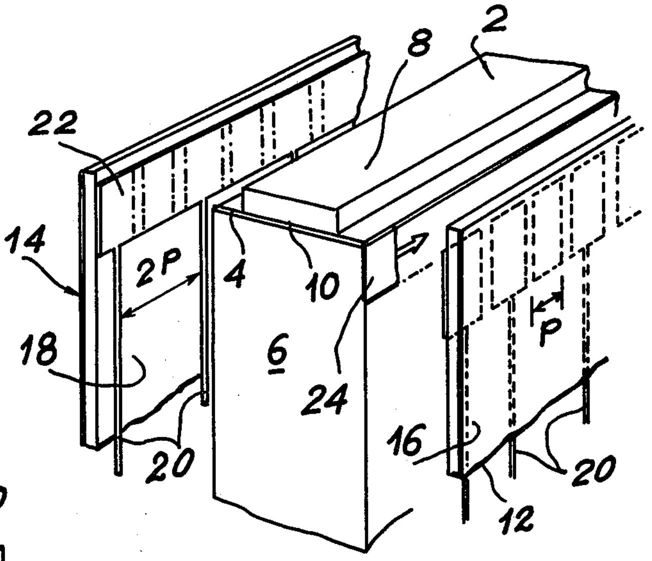
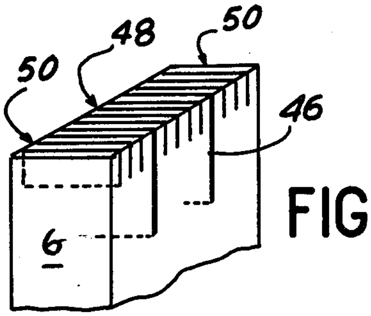
FIG.5
FIG.2
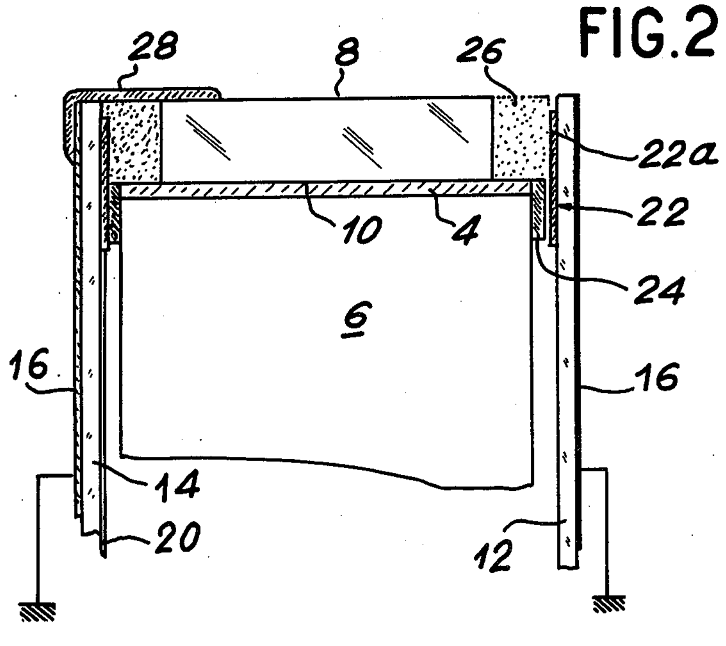

MULTIELEMENT ULTRASONIC PROBE AND ITS PRODUCTION PROCESS

BACKGROUND OF THE INVENTION

The present invention relates to a multielement ultrasonic probe and its production process.

More specifically, the invention relates to a process for the production of an ultrasonic probe comprising a plurality of elementary piezoelectric transducers, juxtaposed either in the form of a linear grating called a strip or in matrix form. The process also relates to the production of a multiannular probe. In this type of probe, the elementary transducers are shaped like rings and are arranged in a concentric manner. These ultrasonic probes are more particularly used in methods for forming medical images by echography.

In such methods, the ultrasonic waves transmitted by the transducers are propagated in the tissues and are reflected on the interfaces (separation or dicontinuity between two media having different acoustic properties). The reflected wave or echo from these interfaces reaches the transducers, which are then used as receivers with a time lag compared with transmission. The time lag increases with increasing distance between the reflecting surface and the probe. This time lag is then measured, and when the time necessary for an outward and return travel of the wave has elapsed, a new pulse can be transmitted.

The echos obtained in this way can be shown, for example, on an oscilloscope screen. A two-dimensional image can be obtained by angularly displacing the transmission beam in the area to be visually displayed, this being called sector scanning.

For ultrasonic imaging by sector scanning, the probes used require small elementary transducers. Thus, it is necessary for the transmission and reception lobe of the ultrasonic waves of these transducers to be circular in order that the sensitivity of each elementary transducer varies only little as a function of the transmission angle. Moreover, the directional characteristic of a transducer is linked with its dimensions and the wider the transducer the more it is directional.

In addition, in order to obtain a correct resolving power, making it possible to distinguish two echo points positioned laterally with respect to the firing line, it is necessary to focus the ultrasonic wave received by the transducers.

In order to permit an effective focusing, the acoustic lens formed, for example, by the linear grating or strip must have a large aperture, i.e. a large size.

The result of these two requirements (sector scanning and focusing of the wave on reception) leads to probes having numerous small components. The small size of the transducer components and their large number cause considerable cabling problems. Thus, the two faces of each elementary transducer must be connected on the one hand to earth and on the other to a connector constituting a connection to the processing electronics. If is very difficult to weld these wires to each elementary transducer and requires a tedious manual operation.

BRIEF SUMMARY OF THE INVENTION

The present invention makes it possible to obviate these disadvantages and relates to an improvement to the methods for connecting elementary transducers to a connector.

The invention therefore relates to a process for the production of a multielement ultrasonic probe, wherein at least one piezoelectric ceramic block having two conductive faces, namely an upper face and a lower face, is mechanicaly connected to two printed circuits, each having an entirely metallized face and a face provided with parallel conductive strips, one of the conductive layers of the said block is electrically connected to one of the faces of the printed circuits and the other conductive layer of said block is connected to the other face of the printed circuits and the ceramic block and the upper part of each printed circuit is cut out so as to form separated piezoelectric elements, these elements being mechanically insulated and the connections for each of these elements being electrically insulated, each printed circuit comprising half its connections which are defined by the entirely metallized faces and the conductive strips.

According to a preferred embodiment of the invention, the mechanical connection between the ceramic block and the printed circuits is provided by means of an electrically insulating mechanical shock absorber, said block being glued to the shock absorber, e.g. by means of a conductive glue.

According to another preferred embodiment of the invention, the upper part of the mechanical shock absorber is cut out so as to form a separate transmitting part and a separate receiving part on the probe.

The multielement ultrasonic probe obtained according to the production process comprises at least one piezoelectric ceramic block having two conductive layers, an upper layer and a lower layer, two printed circuits each having an entirely metallized base and a face provided with parallel conductive strips, the ceramic block being mechanically connected to the two printed circuits, one of the conductive layers of the block being electrically connected to one of the faces of the printed circuits and the other conductive layer of the block being connected to the other face of the printed circuits, the ceramic block and the upper part of each printed circuit being entirely cut out to form the piezoelectric elements which are mechanically separated from one another and equidistant with respect to one another and the connections relative to each of them, each printed circuit comprising half its connections which are defined by the entirely metallized faces and the conductive strips.

As a result of making the transmitting part separate from the receiving part, it is possible to obtain a better focusing of the ultrasonic wave received by the transducers.

BRIEF DESCRIPTION OF THE DRAWINGS

The invention is described in greater detail hereinafter relative to non-limitative embodiments and the attached drawings, wherein show:

FIG. 1 diagrammatically, the production process of an ultrasonic probe according to the invention.

FIG. 2 diagrammatically, a first variant of the process of FIG. 1.

FIG. 5 diagrammatically, a variant of the ultrasonic probe of FIG. 4.

DETAILED DESCRIPTION OF THE PREFERRED EMBODIMENTS

Figure 3:
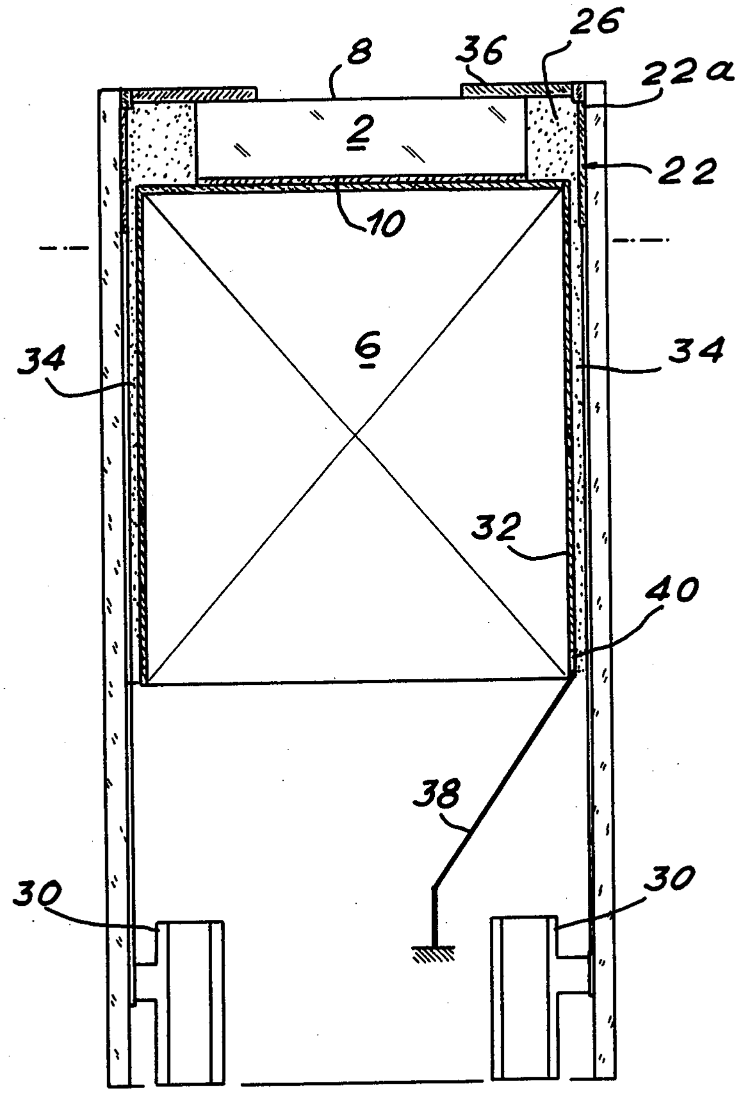
FIG. 3 diagrammatically, a second variant of the process of FIG. 1.

In order to obtain a better understanding of the production of an ultrasonic probe according to the invention, the process will be described on the basis of an ultrasonic probe having a parallelepipedic shape at the end of production. This process is diagrammatically illustrated in FIGS. 1, 2 and 3 and the thus obtained probe is shown in FIG. 4.

The process according to the invention uses a parallelepipedic piezoelectric ceramic block 2, diagrammatically shown in FIG. 1, which is glued by means of a conductive glue 4 to a parallelepipedic insulating support 6, which is preferably a mechanical shock absorber. This ceramic block 2 has a length defined by that of the probe to be produced and a width of approximately 1 cm. This ceramic block 2 comprises two conductive layers, an upper layer 8 and a lower layer 10.

In addition, the probe comprises two printed circuits 12 and 14, each having half the electrical cabling of the probe. Each of the printed circuits 12, 14 has an entirely metallized face 16 and a face 18 provided with parallel conductive strips 20. The conductive strips 20 are arranged equidistantly of one another, the distance being equal to 2*p*. On the upper part of the faces 18 of printed circuits 12, 14 is deposited over the entire width of the circuits a conductive metal tape of approximate width 2 mm. The conductive strips 20 pass in perpendicular manner from tape 22. The printed circuits 12 and 14 obtained in this way are laterally fixed to the insulating support 6 in such a way that the faces 18 provided with the conductive strips 20 face one another in such a way that strips 20 of one of the circuits are displaced relative to the conductive strips of the other circuit by a distance equal to p. The use of two printed circuits, each having half the electrical cabling of the probe, makes it possible to considerably reduce crosstalk or the electrical capacitance of the probe.

A ribbon of conductive glue 24, diagrammatically shown in FIG. 2, is then deposited along the conductive tape 22 so as to connect the lower conductive layer 10 of ceramic block 2 to the middle tape 22. This ribbon of conductive glue 24 is not to touch the lateral parts of ceramic block 2 so as not to short-circuit the conductive layers 8, 10 of said block.

An insulating resin 26, diagrammatically shown in FIG. 2, is then positioned between the ceramic block 2 and the upper part of metal tape 22, designated 22*a*, and is level with the upper conductive layer 8 of ceramic block 2. A conductive layer 28 is then placed on the insulating resin 26 making it possible to electrically connect the upper conductive layer 8 of ceramic block 2 to the entire metallized face 16 of printed circuits 12 and 14.

Figure 4:
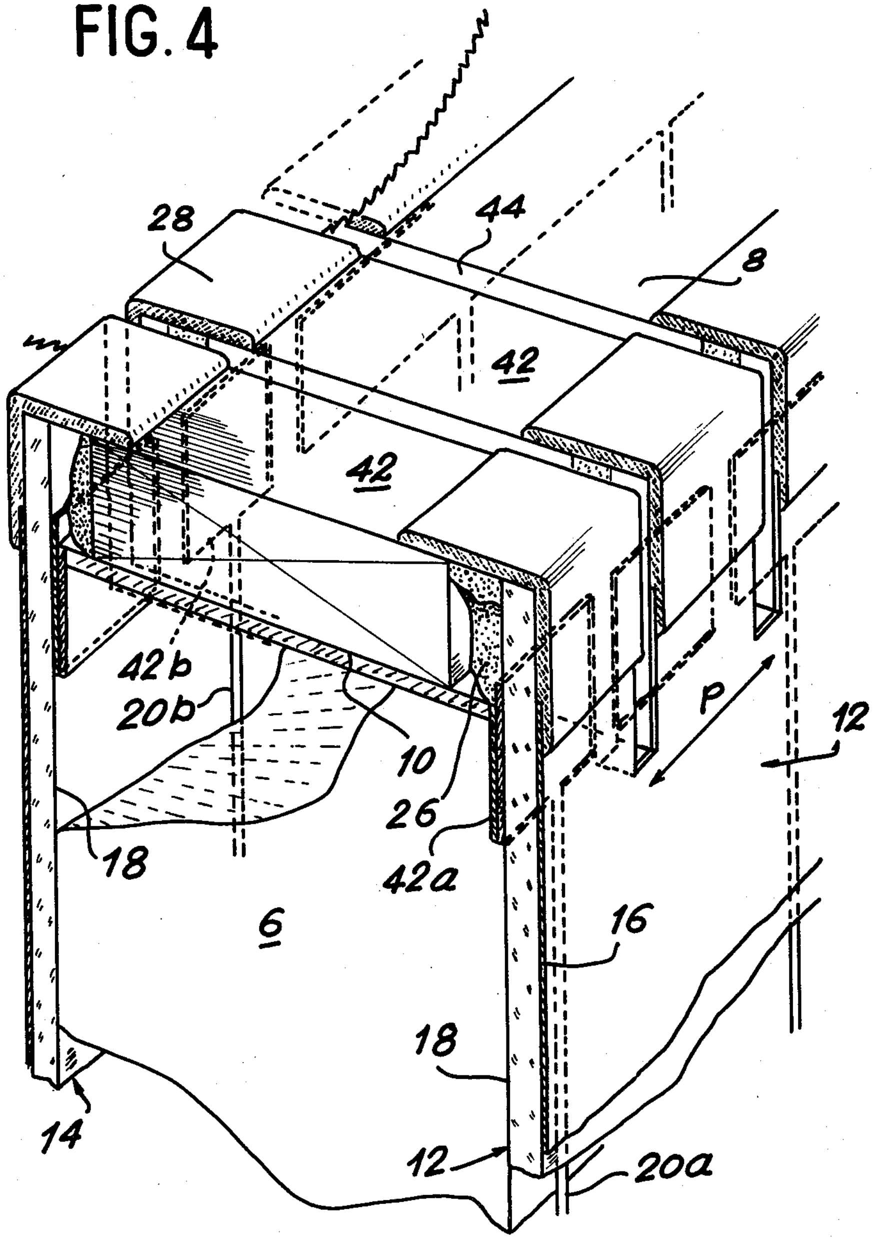
FIG. 4 diagrammatically, a parallelepipedic ultrasonic probe obtained by the process of the invention.

The metallized face 16 of printed circuits 12 and 14 constitutes a reference face connected to ground, whilst face 18 of printed circuits 12, 14 is connected to a connector 30 positioned on the upper part of printed circuits 12, 14 and diagrammatically shown in FIG. 3 serving as a connection with the not shown processing electronics. Consequently, in the embodiment shown in FIG. 2, the upper conductive layer 10 of ceramic block 2 is connected to connector 30 and the upper conductive layer 8 of ceramic block 2 is connected to ground.

In FIG. 3, which shows another embodiment, the upper conductive layer 8 of ceramic block 2 is connected to connector 30, whilst the lower conductive face 10 of ceramic block 2 is connected to ground. In this embodiment, the mechanical shock absorber 6 has all its faces covered by a metal deposit 32.

In this embodiment, the printed circuits 12 and 14 are produced and fixed as described hereinbefore and ceramic block 2 is glued by means of a conductive glue 4 to the metallized shock absorber 6. In the same way, an insulating resin 26 is deposited between the ceramic block 2 and the upper part 22*a* of metal tape 22.

In this embodiment, an insulating layer 34 is placed on the metal layer 32 deposited on shock absorber 6 facing printed circuits 12 and 14. On insulating resin 26 above the upper conductive layer 8 of ceramic block 2 is deposited a conductive layer 36 making it possible to electrically connect the upper layer 8 of ceramic block 2 to face 18 of printed circuits 12, 14, faces being provided with conductive strips 20.

In this embodiment, the lower conductive layer 10 of ceramic block 2 is connected via conductive glue 4 and metal layer 32 to ground, e.g. by means of a wire 38 which can be glued by a conductive glue 40 to the substrate of the printed circuits or to the shock absorber 6.

The use of an electrical ground constituted by a large metal surface area (metal layer 32) provides a very effective shielding of the complete probe.

The probe produced by one of the embodiments described hereinbefore is then cut out by means of a wire saw or a diamond saw, as shown in FIG. 4, so as to produce the mechanically insulated elementary transducer elements 42, whilst the connections for each of these elements are electrically insulated. For this purpose, it is necessary to completely cut out the ceramic block 2 and metal tape 22 deposited on the upper part of faces 18 of printed circuits 12, 14. The connections of each transducer 42 are constituted on the one hand by conductive strips 20 of printed circuits 12, 14, with one conductive strip 20 for each transducer, and on the other hand either by the metallized face 16 of said circuits or by the conductive layer 32 of shock absorber 6.

The cuts or channels 44 are made at a distance equal to p making it possible, for example, to connect one of the ends of the transducer 42*a* to connector 30 by means of the conductive strip 20*a* of printed circuit 12 and to connect one of the ends of transducer 42*b* to connector 30 by means of conductive strip 20*b* of printed circuit 14. The other end of transducers 42*a* and 42*b* is connected respectively to the metallized face 16 of circuits 14 and 12.

The width of each conductive strip 20 must be less than channel 14 so as not to cut into two parts the said strips, which would create a short-circuit of all the transducer elements.

As shown in FIG. 5, part of the shock absorber 6 can be cut so as to form two channels 46, thereby providing a separate transmitting part 48 and receiving part 50. Through separating transmitting part 48 and receiving part 50, it is possible to obtain a better focusing power of the ultrasonic wave received by the receiving transducers, because in this case the transmitting part 48 has only a limited participation in the focusing and a high level of mechanical insulation between the high transmission level transmitting part and the low receiving level receiving part.

Figure 6:
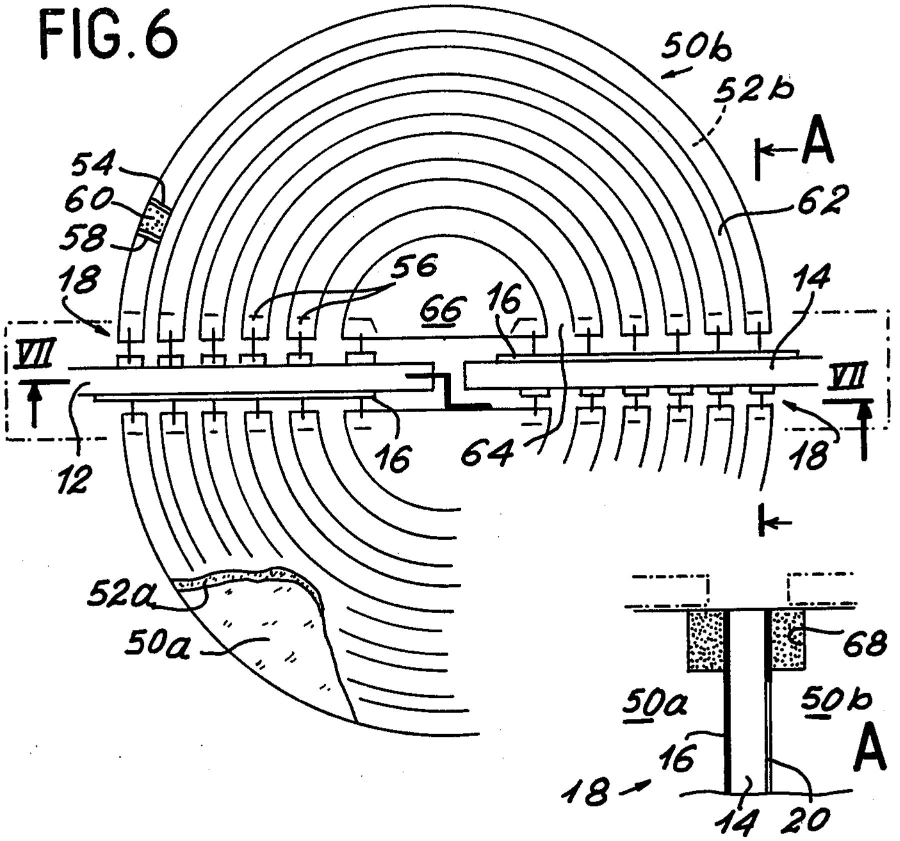
FIG. 6 diagrammatically, a plan view of a multiannular probe obtained according to the process of the invention.
Figure 7:
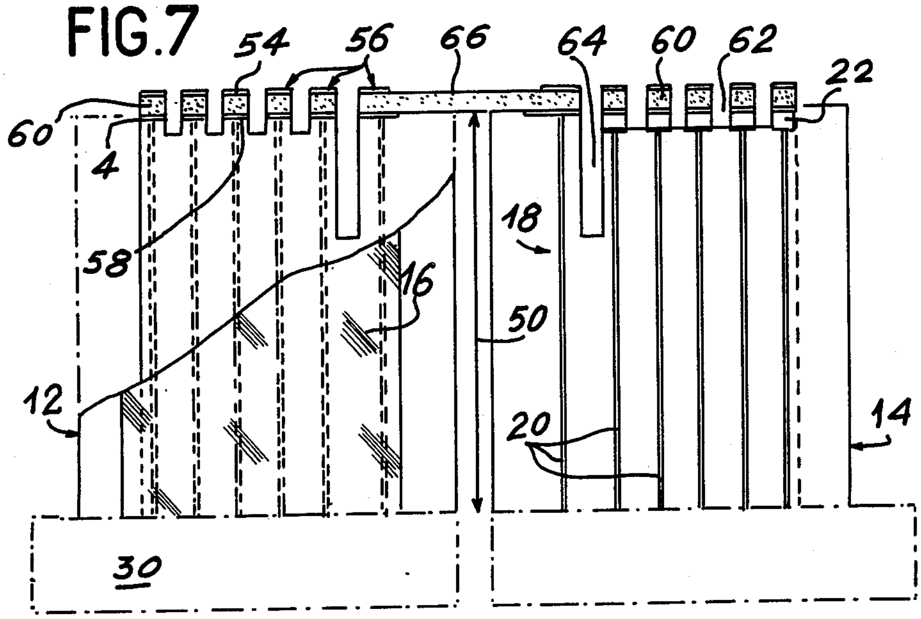
FIG. 7 diagrammatically, a cross-section of FIG. 6.

This method of cabling and cutting out the probe also applies to other multielement probe shapes, such as for example the multiannular probes shown in FIGS. 6 and 7.

In this embodiment, the mechanical shock absorber 50 is constituted by two half-cylinders 50*a* and 50*b* to which are glued by means of a conductive glue 40 two ceramic half-pellets 52*a* and 52*b*. The two half-cylinders 50*a*, 50*b* are positioned on either side of two printed circuits 12, 14, constructed in the manner described hereinbefore and joined together. Printed circuits 12, 14 are fixed to the half-cylinders 50*a*, 50*b* in such a way that the metallized face 16 of printed circuit 12, as well as face 18 of printed circuit 14 and which is provided with conductive strips 20 are fixed to the same half-cylinder 52*a*, whilst metallized face 16 of printed circuit 14 and face 18 of printed circuit 12, which is provided with conductive strips 20 are fixed to the same half-cylinder 52*b*.

As in the previously described construction, each of the printed circuits carries half the conductive strips.

As in the embodiment shown in FIG. 2, the upper conductive layer 54 of ceramic pellets 52 is electrically connected to the metallized face 16 of printed circuits 12, 14 by means of a conductive layer 56 and the lower conductive layer 58 of ceramic pellets 52 is connected to face 18 provided with conductive strips 20 of printed circuits 12, 14 by means of metal tape 22 and a ribbon glue. As hereinbefore, insulants are provided to prevent the short-circuiting of the two conductive layers 54 and 58 of ceramic pellets 52.

The probe produced in this way can then be cut so as to obtain elementary transducers 60 having an annular concentric shape and separated from one another mechanically by channel 62, whilst being positioned at a distance equal to that separating the conductive strips 20 of one and the same printed circuit. As hereinbefore, for obtaining connections relative to each of the transducers 60, it is necessary to cut out the complete thickness of the ceramic half-pellets 50, as well as the upper part of printed circuits 12, 14. A larger cut 64 can be made with respect to the central transducer 66, as hereinbefore, so as to separate the transmitting part 66 from the receiving part. Under these conditions, it is necessary to cut out the upper part of the two half-cylinders 50*a*, 50*b*.

It should be noted that for the constructon of a multiannular probe, there is no need to use two half-pellets such as 52*a*, 52*b*. The following procedure can be adopted. Each half-cylinder 50*a*, 50*b* has, in contact with printed circuits 12, 14, a groove 68 in the manner shown in diagram A, which is filled with conductive glue and whose depth is less than the depth of channel 62. This conductive glue establishes the contact with the printed circuits on the one hand and with the lower ceramic layer 56 on the other. The ribbon of conductive glue is cut out at the same time as the ceramic material, which separates the elementary transducers.

All the hitherto described constructions according to the invention involve the use of two double-faced printed circuits, one of the faces 18 being provided with conductive strips 20 and the other being entirely metallized, i.e. 16. It is obvious that the invention also covers equivalent constructions, such as those using a single double-faced printed circuit as described hereinbefore or using two single-faced printed circuits, one provided with the conductive strips and the other with an entirely metallized layer, as from the moment on which mechanical connection takes place between a circuit carrying the connections and a piezoelectric ceramic block and where a cutting operation is performed to mechanically insulate the elementary piezoelectric transducers and electrically insulate their useful signal excitation and/or sampling connection.

Finally, this procedure also applies to matrix-like probes by juxtaposing linear gratings or strips of piezoelectric material, separated by double-faced printed circuits, each strip being associated with adjacent printed circuits. A cut in the direction perpendicular to the strips makes it possible to mechanically insulate the elementary transducers and electrically insulate their connections.

What is claimed is:

1. A multielement ultrasonic probe, comprising: at least one piezoelectric ceramic block constituted by two half-pellets having upper and lower conductive layers;
   two co-planar printed circuits each having an entirely metallized base and a face providing with parallel conductive strips, the ceramic block being mechanically connected to the two printed circuits by means of an electrically insulating mechanical shock absorber formed from two half cylinders located on either side of the printed circuits, the block being glued to the shock absorber, the upper layer of the block being electrically connected to the face entirely metallized of the printed circuits and the lower layer of the block being connected to the other face of the printed circuits, the ceramic block and the upper part of each printed circuit being entirely cut out to form the piezoelectric elements which are mechanically separated from one another by concentric channels and equidistant with respect to one another and the connections relative to each of them, each printed circuit comprising half its connections which are defined by the entirely metallized faces and the conductive strips.

2. A multielement ultrasonic probe, comprising: at least one piezoelectric ceramic block constituted by two half pellets having upper and lower conductive layer, two co-planar printed circuits each having an upper part, an entirely metallized face and a face provided with parallel conductive strips, the ceramic block being mechanically connected to the two printed circuits by means of a mechanical shock absorber formed from the two half cylinders having plural faces of which all are covered with a metal deposit, the block being glued to the shock absorber by means of a conductive glue, the upper layer of the block being electrically connected to the face of the printed circuits provided with the conductive strips, the ceramic block and the upper part of each printed circuit being entirely cut out to form the piezoelectric elements which are mechanically separated from one another by concentric channels and equidistant with respect to one another and the connections relative to each of them, said connections being defined by the conductive strips and by the metal deposit of the shock absorber.

* * * * *